United States Patent
Rosado et al.

(10) Patent No.: US 12,255,121 B2
(45) Date of Patent: Mar. 18, 2025

(54) POWER SEMICONDUCTOR COOLING ASSEMBLY

(71) Applicant: Hamilton Sundstrand Corporation, Charlotte, NC (US)

(72) Inventors: Sebastian Pedro Rosado, Nuremberg (DE); Karthik Debbadi, Kronshagen (DE)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 137 days.

(21) Appl. No.: 17/883,960

(22) Filed: Aug. 9, 2022

(65) Prior Publication Data

US 2023/0052028 A1 Feb. 16, 2023

(30) Foreign Application Priority Data

Aug. 11, 2021 (EP) .................... 21190901

(51) Int. Cl.
*H01L 23/473* (2006.01)
*H01L 23/367* (2006.01)

(52) U.S. Cl.
CPC ........ *H01L 23/473* (2013.01); *H01L 23/3672* (2013.01)

(58) Field of Classification Search
CPC ... H01L 23/473; H01L 23/3672; H01L 23/36; H01L 23/367; H01L 23/051; H01L 23/3735; H01L 23/492; H01L 23/5286; H01L 2224/73265; H05K 7/20927; H05K 7/1432; H05K 7/14329; H05K 7/209; H05K 7/203

See application file for complete search history.

(56) References Cited

U.S. PATENT DOCUMENTS

| | | | |
|---|---|---|---|
| 5,111,280 A * | 5/1992 | Iversen ................. | H01L 23/427 257/713 |
| 10,283,436 B2 | 5/2019 | Schuderer et al. | |
| 10,818,605 B2 | 10/2020 | Kiel et al. | |
| 10,985,088 B2 | 4/2021 | Mrad et al. | |
| 2007/0114665 A1 | 5/2007 | Bayerer | |
| 2009/0079058 A1 * | 3/2009 | Conn ................. | H05K 7/20927 257/691 |
| 2009/0161301 A1 * | 6/2009 | Woody ................. | H05K 7/209 361/678 |

(Continued)

FOREIGN PATENT DOCUMENTS

| | | |
|---|---|---|
| JP | 2000315757 A | 11/2000 |
| JP | 2009273276 A | 11/2009 |

OTHER PUBLICATIONS

Abstract of JP2000315757 (A), Published: Nov. 14, 2000, 1 page.

(Continued)

*Primary Examiner* — Adam B Dravininkas
(74) *Attorney, Agent, or Firm* — CANTOR COLBURN LLP

(57) ABSTRACT

A power switch module includes a semiconductor die and a conductive busbar. The semiconductor die is electrically conductively mounted to the busbar. The module also includes a dielectric coolant fluid and the busbar and the semiconductor die mounted thereto are immersed in the dielectric coolant fluid. The module can be include in a power converter assembly.

15 Claims, 3 Drawing Sheets

(56) References Cited

U.S. PATENT DOCUMENTS

| | | | |
|---|---|---|---|
| 2010/0302729 A1* | 12/2010 | Tegart | H05K 7/1457 |
| | | | 361/698 |
| 2014/0218858 A1* | 8/2014 | Shelnutt | H05K 7/203 |
| | | | 361/679.31 |
| 2018/0040538 A1* | 2/2018 | Schuderer | H01L 29/1608 |
| 2019/0311972 A1 | 10/2019 | Kiel | |
| 2022/0319956 A1* | 10/2022 | Joshi | H01L 23/427 |

OTHER PUBLICATIONS

Abstract of JP2009273276 (A), Published: Nov. 19, 2009, 1 page.
European Search Report for Application No. 21190901.5, mailed Jan. 18, 2022, 52 pages.
Steger, "A New Generation of Power Modules with Sinter-Technology for the Automotive Industry". Electric Drives Production Conference (EDPC), 2011 1st International, IEEE, Sep. 28, 2011 (Sep. 28, 2011), pp. 60-62.

* cited by examiner

POWER SEMICONDUCTOR COOLING ASSEMBLY

CROSS-REFERENCE TO RELATED APPLICATIONS

This application claims priority to European Patent Application No. 21190901.5 filed Aug. 11, 2021, the entire contents of which is incorporated herein by reference.

TECHNICAL FIELD

The present disclosure relates to improving heat dissipation from power semiconductors.

BACKGROUND

Power circuits such as power converters include a number of switching devices often in the form of semiconductor switching devices. A semiconductor switching device is usually in the form of a semiconductor die unit and several such units are usually connected to the remainder of the power circuit by means of a busbar which is then mounted to a base plate, or to an interface layer in the case of baseplate-less designs, usually via an intermediate layer e.g. a ceramic substrate to provide electrical isolation between the electrical circuitry and the cooling circuit/fluid. The interface layer, either the base plate or a heat conducting interface, is attached to a heat sink and typically a cooling fluid is flowed through the heat sink (i.e. across the side of the heat sink furthest from the busbar and semiconductor chip).

Although it is desirable to maximise the power density of the power module by including several semiconductor dies, or chips, in one power module, power density is limited by the ability to dissipate heat away from the chip. With the conventional designs as briefly described above, there are a number of layers of different materials between the semiconductor device and the coolant. The relatively high thermal impedance provided by these layers limits the heat conduction from the chip. Therefore, the operating temperature range and power density of the power module is limited and/or the semiconductor chip power conversion capacity is not fully utilized.

There is a need to improve the cooling efficiency in a liquid cooled power circuit.

SUMMARY

According to the present disclosure, there is provided a power module that can group more than one power switching unit, each one comprising a semiconductor die and a conductive busbar, the semiconductor die being electrically conductively mounted to the busbar, and further comprising a dielectric coolant fluid, the busbar and the semiconductor die mounted thereto being immersed in the dielectric coolant fluid.

The semiconductor die may be electrically connected to the busbar in any known manner but provides additional advantages if sintered directly thereto.

The semiconductor die may be mounted to one or more busbars e.g. a source busbar and a drain busbar.

The busbar is made of an electrically conductive material e.g. copper.

Any manner of immersing the switching unit in the coolant would be advantageous over the prior assemblies, but in one example, the coolant is forcibly and continuously flowed past the busbar(s). For example, coolant can be flowed into an inlet of a housing for the module and out of an outlet at an opposite end of the housing.

The busbar can be a straight bar or could be formed in a pattern of channels to improve heat transfer.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
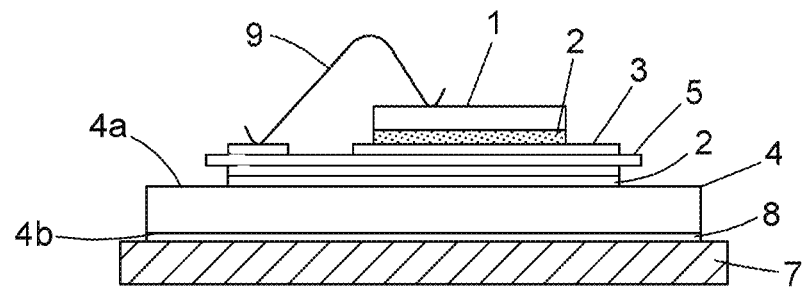
FIG. 1 is a schematic sectional view of a conventional switching cell with a complete package that includes a baseplate.

FIG. 1 shows a typical switching device arrangement in a power circuit. The electronics are provided as a semiconductor chip or die 1. This is connected, e.g. by solder 2, to external circuitry (not shown) by means of a conductive busbar 3 e.g. a copper busbar to which more dies may be connected. The busbar 3 is mounted onto a base plate 4, to one side 4a, where the busbar is attached, but electrically isolated via an insulating layer 5 of dielectric material e.g. ceramic substrate and an additional metallic layer 55. A coolant (not shown in FIG. 1) flowing inside a heat sink 7 mounted along the opposite side 4b of the base plate 4 evacuates the heat generated by the semiconductor. The connection of the power module to the circuit can be by means of e.g. bond wires 9 or sintering a conductive layer. Moreover, in most cases the baseplate is attached to the heat-sink 7 using a thermal interface material 8 that contributes with additional thermal resistance.

As can be seen, there are several layers of different materials between the semiconductor chip 1 and the cooling assembly, and, particularly, the cooling fluid that would flow inside the heat sink 7 beneath the base plate 4. This provides a relatively high thermal impedance thus limiting the ability of the assembly to dissipate heat from the chip 1.

Figure 2:
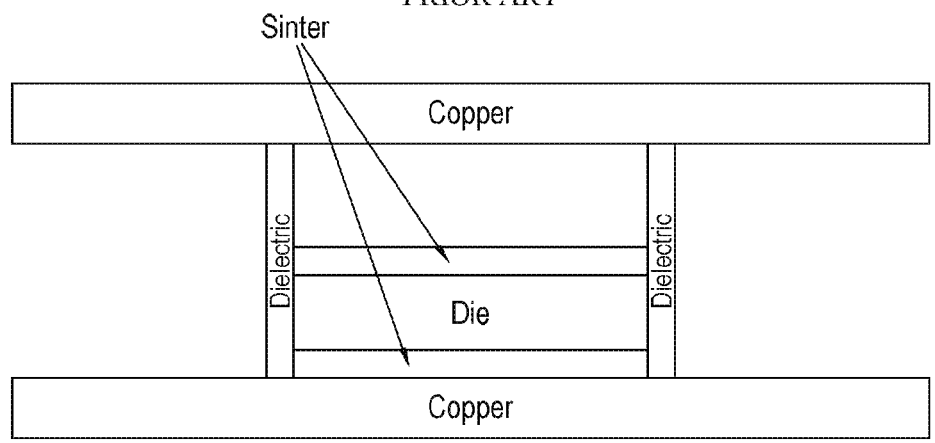
FIG. 2 is a schematic sectional view of an alternative known assembly.
Figure 3:
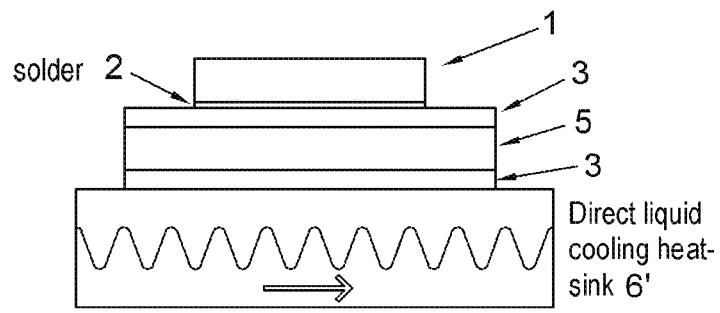
FIG. 3 is a schematic sectional view of a package with a direct liquid cooled assembly.

Some methods have been proposed to improve cooling, such as shown in FIGS. 2 and 3. FIG. 2 shows a design in which the semiconductor die is provided with two interfaces to allow thermal flow from each side of the semiconductor chip. Whilst this provides a greater surface area from which heat can dissipate, the use of dielectric and base plate layers is still required and the high thermal impedance is still, therefore, a limiting factor. FIG. 3 shows an assembly using direct liquid cooling, whereby the flow of coolant is integral with the heat sink 6'. This assembly partially reduces the total thermal impedance when compared to the assembly in FIG. 1.

Reducing the thermal impedance e.g. by eliminating some or all of the intermediate layers and/or improving the thermal conductivity of remaining layers results in improved cooling of the semiconductor chip.

Figure 5:
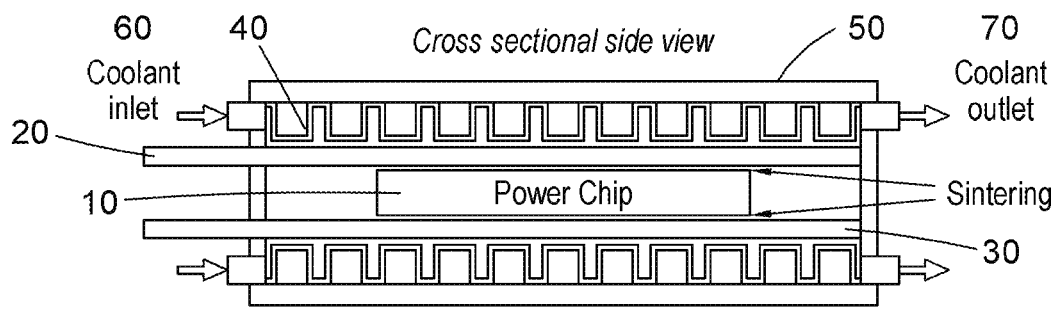
FIG. 5 is a sectional side view of another assembly according to the disclosure.
Figure 6:
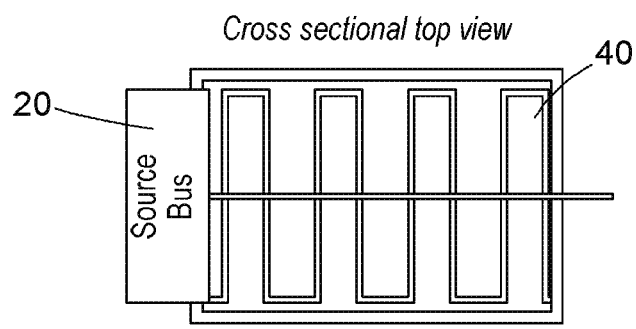
FIG. 6 is a sectional top view of the assembly of FIG. 5.

To achieve improved cooling, in the assembly of this disclosure, rather than the chip being mounted to a busbar and then the busbar being mounted via a dielectric layer to a base plate below with coolant fluid flows, the cooling is provided by the chip and busbar to which it is (directly) mounted being immersed in coolant fluid as shown in FIGS. 5 and 6. The coolant fluid is non-conductive. This thus avoids the additional thermal impedance of the dielectric and base plate layers and provides a direct cooling of the chip over the greatest possible surface area.

Figure 4:
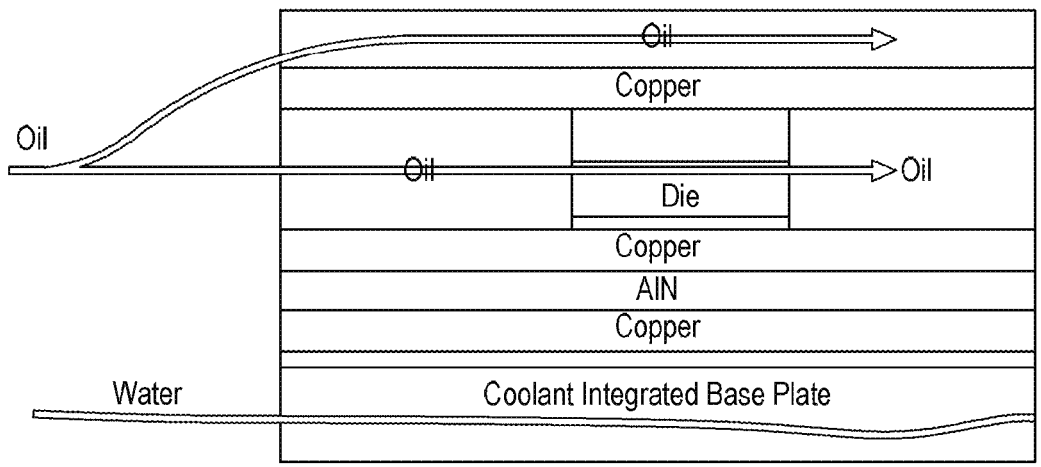
FIG. 4 is a schematic sectional view of the direct cooling concept proposed by this disclosure in a simple implementation.

FIG. 4 shows a simple, yet possible, implementation of a direct cooling, through a dielectric coolant, concept as proposed by this disclosure, where the coolant is in direct contact with the heat source, i.e. the semiconductor. In this case the base plate is adapted to directly accommodate the coolant flow. Such baseplate implementation removes one layer of thermal impedance, but still requires the dielectric (ceramic substrate) and the base plate. This embodiment also employs two types of coolants, one of them with dielectric properties, in contact with the semiconductor, while another coolant that without dielectric properties, flowing through or below the baseplate. Although the use of two coolant fluids could provide good performance it increases the system complexity. It is necessary to further reduce the thermal layers while keeping the system simple.

FIGS. 5 and 6 show alternative examples, in which the semiconductor chip 10 is sintered directly to a busbar for connection to the external circuitry. In the example shown, the chip 10 is sintered to a source bus 20 and a drain bus 30 but assemblies can be envisaged with only one bus. The combined switching unit of chip and busbar(s) is immersed in coolant fluid 40. In the example shown, the module is provided in a housing 50 having a coolant inlet 60 at one end and a coolant outlet 70 at the opposite end such that coolant can continuously flow through the housing across the surfaces of the busbar(s) opposite the surface to which the chip 10 is sintered. In this way, only the busbar material and the sinter material provides thermal impedance between the coolant 40 and the chip 10.

The shape of the busbar can be designed to facilitate the transfer of heat from the busbar to the coolant. The busbar can be designed to form different coolant channel patterns such as that shown in FIG. 6 or alternative patterns e.g. microchannels.

The direct attachment of the busbar(s) to the chip also increases the mechanical strength of the assembly.

As mentioned above, to ensure the necessary electrical isolation, the coolant fluid must be non-electrically conductive. It should also be non-combustible, have a high thermal coefficient and low viscosity.

To further increase the transfer surface from the heat source (the semiconductor die) to the coolant fluid, conductive connections can be used. The high thermal conductivity of the busbars e.g. of copper, is used to spread the heat and thus increase the thermal conductivity in the heat dissipation path.

The immersion of the switching cell in the cooling fluid thus minimises the thermal impedance between the device and the coolant.

The effect of the reduction in thermal impedance can be shown using thermal impedance equivalent circuits to compare various designs.

Figure 7A:
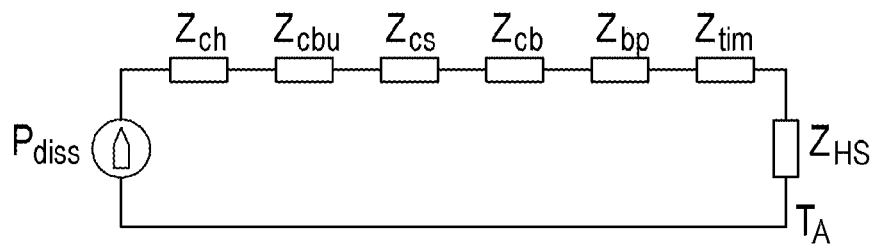
FIGS. 7A and 7B show equivalent circuits for known assemblies.
Figure 7B:
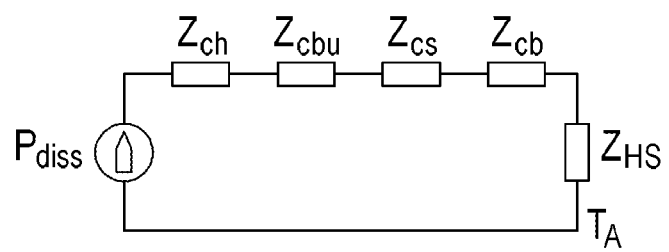
Figure 7C:
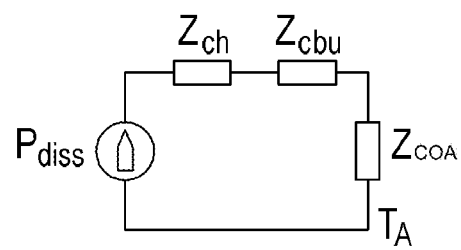
FIG. 7C shows an equivalent circuit for an assembly such as shown in FIGS. 5 and 6.

In FIGS. 7A, 7B and 7C, the impedance elements refer to the thermal impedances as follows:

$Z_{ch}$: thermal impedance of the semiconductor chip
$Z_{cbu}$: thermal impedance of the copper busbar (including attachment, i.e. solder)
$Z_{cs}$: thermal impedance of the ceramic substrate (including attachment)
$Z_{cb}$: thermal impedance of the copper bonding layer
$Z_{bp}$: thermal impedance of the baseplate
$Z_{tim}$: thermal impedance of the thermal interface material
$Z_{hs}$: thermal impedance of the heat-sink and to the ambient
$Z_{CoA}$: thermal impedance of the coolant and to the ambient FIG. 7A shows the thermal impedances existing on the assembly for a classically bond-wired system with baseplate and thermal interface material (TIM), such as shown in FIG. 1. By using a direct liquid cooling assembly (such as shown in FIG. 3), instead, the thermal impedances of the assembly are reduced as shown in FIG. 7B. FIG. 7C shows the much reduced thermal impedance for the assembly of the present disclosure.

The described assembly enables power electronic converters and the like to be developed with greatly increased power densities compared to existing designs. This is a critical performance indicator in many fields e.g. in aerospace power converter applications. The design can also provide improved voltage insulation for smaller dimensions. Further, uniform thermal heat can result in reliability improvements of the overall assembly.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

The invention claimed is:

1. A power switch module comprising:
   a semiconductor die; and
   a source conductive busbar;
   a drain conductive busbar;
   wherein the source conductive busbar and the drain conductive busbar are directly sintered to the semiconductor die; and
   a dielectric coolant fluid wherein the busbar and the semiconductor die mounted thereto are immersed in the dielectric coolant fluid.

2. The module of claim 1, wherein the semiconductor die is attached to the source and drain conductive busbars on opposite sides of the semiconductor die.

3. The module of claim 1, wherein the source and drain conductive busbar are made of copper.

4. The module of claim 1, wherein the coolant is forcibly and continuously flowed past the source and drain conductive busbars busbar.

5. The module of claim 4, wherein the semiconductor die and the source and drain conductive busbars are provided in a module housing having an inlet and an outlet, wherein coolant flows into the inlet and out of the outlet.

6. The module of claim 5, wherein the inlet and the outlet are placed at opposite ends of the housing.

7. The module of claim 1, wherein the source and drain conductive busbars are is formed in a pattern of channels to improve heat transfer.

8. A power converter assembly comprising:
one or more power switch modules as claimed in claim 1.

9. A power converter assembly as claimed in claim 8, wherein the assembly is configured for use in an aircraft power system.

10. A power converter of claim 8, wherein the semiconductor die is attached to the source and drain conductive busbars on opposite sides of the semiconductor die.

11. A power converter of claim 8, wherein the source and drain conductive busbar are made of copper.

12. A power converter of claim 8, wherein the coolant is forcibly and continuously flowed past the source and drain conductive busbars busbar.

13. A power converter of claim 12, wherein the semiconductor die and the source and drain conductive busbars busbar are provided in a module housing having an inlet and an outlet, wherein coolant flows into the inlet and out of the outlet.

14. A power converter of claim 13, wherein the inlet and the outlet are placed at opposite ends of the housing.

15. A power converter of claim 8, wherein the source and drain conductive busbars are is formed in a pattern of channels to improve heat transfer.

* * * * *